(12) United States Patent
Tanaka et al.

(10) Patent No.: US 9,559,235 B2
(45) Date of Patent: Jan. 31, 2017

(54) PHOTOELECTRIC CONVERSION DEVICE

(75) Inventors: Koichiro Tanaka, Kanagawa (JP); Yu Arita, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 979 days.

(21) Appl. No.: 13/316,631

(22) Filed: Dec. 12, 2011

(65) Prior Publication Data

US 2012/0152314 A1 Jun. 21, 2012

(30) Foreign Application Priority Data

Dec. 17, 2010 (JP) .................................. 2010-281758

(51) Int. Cl.

| | |
|---|---|
| *H01L 31/00* | (2006.01) |
| *H01L 31/042* | (2014.01) |
| *H01L 25/00* | (2006.01) |
| *H02N 6/00* | (2006.01) |
| *H01L 31/054* | (2014.01) |
| *H02S 40/20* | (2014.01) |
| *H02S 40/22* | (2014.01) |
| *H01L 31/0232* | (2014.01) |

(52) U.S. Cl.
CPC ....... *H01L 31/0549* (2014.12); *H01L 31/0232* (2013.01); *H01L 31/054* (2014.12); *H02S 40/20* (2014.12); *H02S 40/22* (2014.12); *H02S 40/00* (2013.01); *Y02E 10/50* (2013.01); *Y02E 10/52* (2013.01)

(58) Field of Classification Search
CPC ............... H01L 31/0232; H01L 31/054; H01L 31/0549; H02S 40/00; H02S 40/20; H02S 40/22; Y02E 10/50; Y02E 10/52

USPC ................ 136/244, 246, 251, 252, 259, 243
See application file for complete search history.

(56) References Cited

U.S. PATENT DOCUMENTS

| | | | | |
|---|---|---|---|---|
| 3,899,359 A | * | 8/1975 | Stachurski | .................... 136/205 |
| 4,023,368 A | * | 5/1977 | Kelly | .............................. 60/698 |
| 5,902,417 A | | 5/1999 | Lillington et al. | |

(Continued)

FOREIGN PATENT DOCUMENTS

| | | |
|---|---|---|
| EP | 1126698 A | 8/2001 |
| EP | 2141748 A | 1/2010 |

(Continued)

*Primary Examiner* — Lindsey Bernier

(74) *Attorney, Agent, or Firm* — Nixon Peabody LLP; Jeffrey L. Costellia

(57) ABSTRACT

The present invention provides a photoelectric conversion device. Specifically, the photoelectric conversion device has a structure in which a substrate including a photoelectric conversion element provided at the bottom and a substrate including a photoelectric conversion element provided at the side are secured in a brace form by a light-dividing device. This structure divides incident light using the light-dividing device into a plurality of wavelength bands, and causes the divided light to fall onto the photoelectric conversion elements provided at the bottom and side, thereby making it possible to provide a photoelectric conversion device which is capable of generating a lame amount of electric power. In addition, the light-dividing device distributes pressures and impacts applied to the substrates at the bottom and side, thus making it possible to provide a photoelectric conversion device which has resistance to pressures and impacts.

20 Claims, 7 Drawing Sheets

(56) References Cited

U.S. PATENT DOCUMENTS

| | | | |
|---|---|---|---|
| 6,608,296 | B1 | 8/2003 | Toyoda et al. |
| 7,345,458 | B2 | 3/2008 | Kanai et al. |
| 7,449,866 | B2 | 11/2008 | Kanai et al. |
| 7,888,589 | B2 | 2/2011 | Mastromatteo |
| 2003/0116185 | A1* | 6/2003 | Oswald .................. 136/251 |
| 2005/0268957 | A1 | 12/2005 | Enomoto et al. |
| 2006/0279707 | A1* | 12/2006 | Kettle et al. .................. 353/84 |
| 2009/0314332 | A1 | 12/2009 | Barnett et al. |
| 2010/0078063 | A1 | 4/2010 | Barnett et al. |
| 2010/0170557 | A1* | 7/2010 | Barnett et al. ............. 136/244 |
| 2010/0175739 | A1* | 7/2010 | Tu .............................. 136/246 |

FOREIGN PATENT DOCUMENTS

| | | |
|---|---|---|
| JP | 51-003788 A | 1/1976 |
| JP | 59-096777 | 6/1984 |
| JP | 09-260696 | 10/1997 |
| JP | 10-093117 | 4/1998 |
| JP | 11-298029 | 10/1999 |
| JP | 2002-170974 A | 6/2002 |
| JP | 2003-333757 | 11/2003 |
| JP | 3150376 B | 5/2009 |
| JP | 2009-545183 | 12/2009 |
| JP | 2009-545184 | 12/2009 |
| WO | WO-00/21284 | 4/2000 |
| WO | WO-2008/038522 | 4/2008 |
| WO | WO-2008/097266 | 8/2008 |
| WO | WO-2009/041038 | 4/2009 |

* cited by examiner

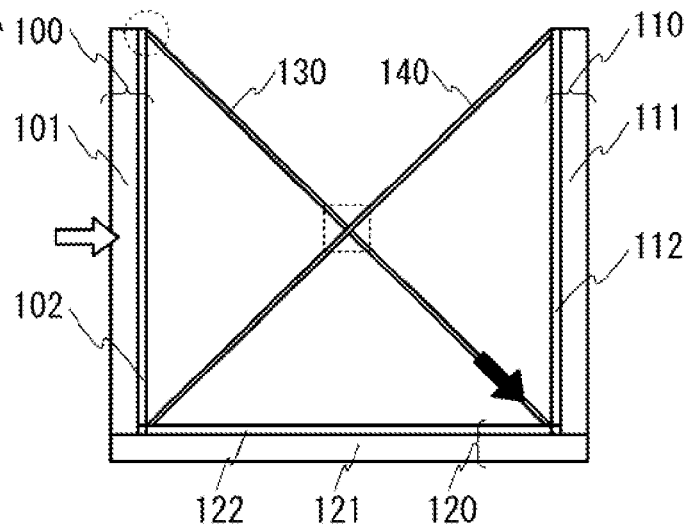
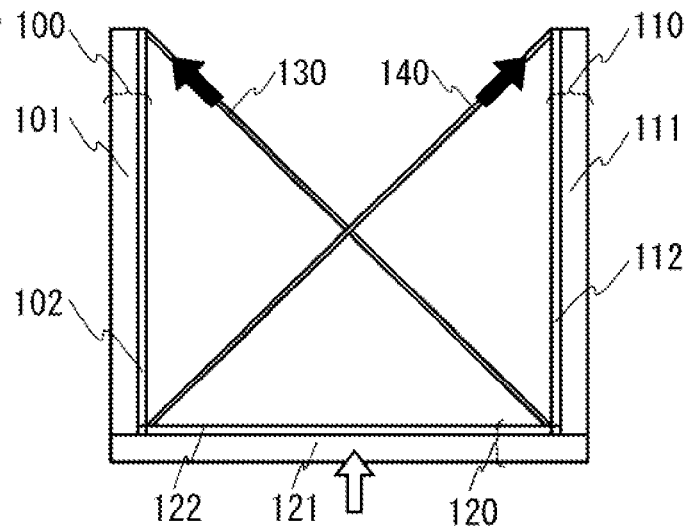
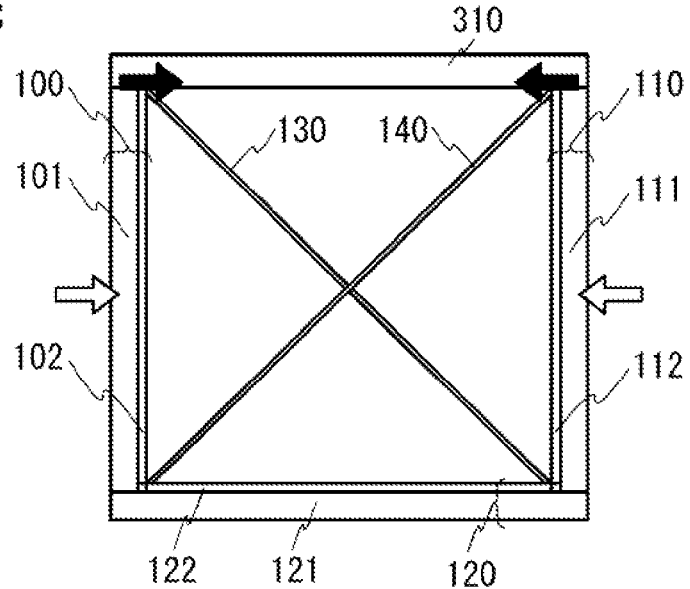

PHOTOELECTRIC CONVERSION DEVICE

BACKGROUND OF THE INVENTION

1. Field of the Invention

The present invention relates to a photoelectric conversion device.

2. Description of the Related Art

In recent years, solar cells which generate electric power without carbon dioxide emissions have been attracting attention from the point of view of global warming prevention. Recently, the Japanese government has started subsidies for solar cells, and moreover, solar cells themselves have come to be less expensive. Thus, solar cells have been in widespread use not only in large-scaled solar power generation facilities but also in standard houses, e.g., on roofs of or outside the houses for power generation.

Therefore, a variety of methods have been suggested in order to increase the amount of electric power to be generated by solar cells. As one of the methods, photoelectric conversion devices have been developed which are achieved by stacking layers for converting incident light into electrical energy (hereinafter, abbreviated as a photoelectric conversion layer). For example, as described in Patent Document 1, a structure is known which is achieved by forming a single crystalline silicon photoelectric conversion layer including a p layer and an n layer as a lower layer and forming an amorphous silicon photoelectric conversion layer including a p layer, an i layer, and an n layer as an upper layer so as to be connected to each other in series.

However, in this stacked structure, incident light first undergoes a photoelectric conversion in the upper photoelectric conversion layer, and then reaches the lower photoelectric conversion layer. For this reason, light loss such as light absorption or reflection by the upper photoelectric conversion layer is caused, and the incident light is thus diminished in the lower photoelectric conversion layer, which results in a decrease in the amount of electric power generated. In addition, there is a need for matching of electric currents produced by the respective photoelectric conversion layers.

Consequently, in order to achieve a large amount of electric power generated from a plurality of photoelectric conversion layers, a photoelectric conversion device using a structure (hereinafter, abbreviated as a light-dividing device) including a layer (hereinafter, abbreviated as a light-dividing layer) which has the function of reflecting light of a specific wavelength and transmitting light of the other wavelengths and a structure (hereinafter, referred to as a photoelectric conversion element) including a photoelectric conversion layer has been suggested as described in Patent Document 2.

In the photoelectric conversion device, incident light is divided by the light-dividing device into a plurality of wavelength bands, and photoelectric conversion elements corresponding to the respective wavelength bands are provided on the optical paths of the reflected, divided light and the transmitted, divided light. Therefore, the light loss can be eliminated which is caused by the stacked structure as described in Patent Document 1. Accordingly, the photoelectric conversion device is capable of generating a large amount of electric power.

On the other hand, photoelectric conversion devices are mainly placed outside, and there is thus a need to expect that pressures due to wind and rain and impacts due to blown-off objects will be applied to the photoelectric conversion devices.

PRIOR ART DOCUMENTS

[Patent document 1] Japanese Published Patent Application No. 59-096777
[Patent document 2] Japanese Translation of PCT International Application No. 2009-545183

SUMMARY OF THE INVENTION

Under the environments described above, in order to operate the photoelectric conversion device stably, there is a need to increase the strength of the device itself.

The present invention is made in view of the foregoing technical background. Therefore, an object of the present invention is to provide a photoelectric conversion device which is capable of generating a large amount of electric power by using incident light divided into a plurality of wavelength bands, and has resistance to pressures and impacts.

In order to achieve the object, the present invention has focused attention on the structure of a light-dividing device. Specifically, a photoelectric conversion device according to one aspect of the present invention has structure in which a substrate including a photoelectric conversion element provided at the bottom and a substrate including a photoelectric conversion element provided at the side are secured in a brace form by a light-dividing device.

The structure divides incident light using the light-dividing device into a plurality of wavelength hands, and causes the divided light to fall onto the photoelectric conversion elements provided at the bottom and side. Therefore, a photoelectric conversion device can be provided which is capable of generating a large amount of electric power. In addition, the light-dividing device distributes pressures and impacts applied to the substrates at the bottom and side, thus making it possible to provide a photoelectric conversion device which has resistance to pressures and impacts.

More specifically, one aspect of the present invention is a photoelectric conversion device including a first substrate including a first photoelectric conversion element, a second substrate including a second photoelectric conversion element, and a third substrate including a third photoelectric conversion element, which are arranged in a substantially U-shaped form, wherein the first substrate and the third substrate are secured in a brace form by a planar first light-dividing device overlapped with the third substrate, wherein the second substrate and the third substrate are secured in a brace form by a planar second light-dividing device overlapped with the third substrate, wherein the first photoelectric conversion element is opposite to the second photoelectric conversion element, wherein the first light-dividing device reflects light in a certain wavelength hand of incident light toward the second photoelectric conversion element, wherein the second light-dividing device reflects light in a certain wavelength band of incident light toward the first photoelectric conversion element, and wherein the third photoelectric conversion element receives light transmitted through the first light-dividing device and the second light-dividing device.

According to one aspect of the present invention, incident light is divided by the light-dividing devices into a plurality of wavelength bands to fall onto the photoelectric conversion elements provided for the first to third substrates. Thus, a photoelectric conversion device can be provided which is capable of generating a large amount of electric power. In addition, the light-dividing devices serve as braces, and thus can distribute, to the third substrate, pressures and impacts applied to the first substrate or/and the second substrate, and distribute, to the first and second substrates, pressures and impacts applied to the third substrate. Therefore, a photoelectric conversion device can be provided which has resistance to pressures and impacts. Furthermore, these advantageous effects are effectively produced with the substantially U-shaped arrangement of the first to third substrates, and the area of the device can be thus prevented from being increased.

In addition, one aspect of the present invention is the photoelectric conversion device, wherein the first light-dividing device and the second light-dividing device have different wavelength bands for a reflectance of 80% or more in a wavelength hand of 350 nm or more and 2000 nm or less.

According to one aspect of the present invention, light can be prevented from being generated, which is reflected by both the first and second light-dividing devices to fail to reach the first to third photoelectric conversion elements. Therefore, a photoelectric conversion device can be provided which is capable of generating a large amount of electric power.

In addition, one aspect of the present invention is the photoelectric conversion device, wherein a protective substrate is provided in a region overlapped with the third substrate, and the protective substrate is secured to or near upper ends of the first substrate and the second substrate.

According to one aspect of the present invention, impacts applied to the first substrate or the second substrate can be distributed by the protective substrate to the opposite substrate. Therefore, a photoelectric conversion device can be provided which has resistance to pressures and impacts. In addition, the protective substrate can protect the light-dividing devices and the photoelectric conversion elements from impacts due to blown-off objects. Therefore, a photoelectric conversion device can be provided which is capable of generating a large amount of electric power over a long period of time.

In addition, one aspect of the present invention is a photoelectric conversion device, wherein the first substrate and the second substrate of the photoelectric conversion device configured as described above have end surfaces secured to portions of adjacent photoelectric conversion devices.

According to one aspect of the present invention, pressures and impacts applied to some photoelectric conversion devices can be distributed to the adjacent photoelectric conversion devices. Therefore, the photoelectric conversion device in which the plurality of photoelectric conversion devices configured as described above are placed can be even provided with resistance to pressures and impacts.

In addition, one aspect of the present invention is the photoelectric conversion device including: a first hollow section surrounded by the first substrate, the first light-dividing device, and the second light-dividing device; a second hollow section surrounded by the second substrate, the first light-dividing device, and the second light-dividing device; and a third hollow section surrounded by the third substrate, the first light-dividing device, and the second light-dividing device, wherein a temperature regulating material is introduced into at least one of the first to third hollow sections to regulate a temperature of at least one of the first to third photoelectric conversion elements.

According to one aspect of the present invention, a temperature regulating material can be introduced into the hollow section in contact with the photoelectric conversion element decreased in electric generating capability due to a change in temperature. In addition, for the photoelectric conversion elements requiring no temperature regulation, incident light can be prevented from being absorbed or reflected due to the introduction of the temperature regulating material. Therefore, a photoelectric conversion device can be provided which suppresses a decrease in the amount of electric power generation due to changes in the temperatures of the photoelectric conversion elements, and a loss in the amount of electric power generation due to the temperature regulating material.

In addition, one aspect of the present invention is a photoelectric conversion device, wherein more than one photoelectric conversion device configured as described above is placed to form: a first through hole obtained by coupling the first hollow sections of the photoelectric conversion devices; a second through hole obtained by coupling the second hollow sections of the photoelectric conversion devices; and a third through hole obtained by coupling the third hollow sections of the photoelectric conversion devices, wherein a temperature regulating material is introduced into at least one of the first to third through holes to regulate the temperature of at least one of the first to third photoelectric conversion elements.

According to one aspect of the present invention, a temperature regulating material can be introduced into the through hole in contact with the photoelectric conversion element decreased in electric generating capability due to a change in temperature. In addition, for the photoelectric conversion elements requiring no temperature regulation, incident light can be prevented from being absorbed or reflected due to the introduction of the temperature regulating material. Therefore, a photoelectric conversion device can be provided which suppresses a decrease in the amount of electric power generation due to changes in the temperatures of the photoelectric conversion elements, and a loss in the amount of electric power generation due to the temperature regulating material.

When the expression "B is formed over A" or "B is formed on A" is explicitly described in this specification, etc., the expression is not limited to the fact that B is formed in direct contact with A. The expression includes cases where A and B are not in direct contact with each other, i.e., cases where another object is interposed between A and B. In this case, each of A and B is intended to be an object (e.g., a device, an element, a circuit, a wiring, an electrode, a terminal, a film, or a layer).

Therefore, for example, when the expression that a layer B is formed on or over a layer A is explicitly described, the expression is intended to include both cases where the layer B is formed in direct contact with the layer A, and cases where another layer (e.g., a layer C or a layer D) is formed in direct contact with the layer A and the layer B is formed in direct contact with the other layer. It is to be noted that the other layer (e.g., the layer C or the layer D) may be a single layer or a plurality of layers.

In addition, the term "light-dividing layer" as used in the specification, etc. refers to a dielectric multilayer film formed from an optical calculation so as to have the function of reflecting light of a specific wavelength band and transmitting light of other wavelength bands.

It is to be noted that "photoelectric conversion layer" as used in this specification, etc. includes in its category a semiconductor layer which exhibits a photoelectric effect (internal photoelectric effect), and moreover includes an impurity semiconductor layer bonded for forming an internal electric field or a semiconductor junction. More specifically, the photoelectric conversion layer refers to a semiconductor layer obtained by bonding a plurality of semiconductor layers which have different carrier types (holes or free electrons) and different carrier concentrations, as typified by a pn junction.

In addition, the term "photoelectric conversion efficiency" as used in this specification, etc. refers to an efficiency of a photoelectric conversion device converting energy from sunlight to electric power.

Furthermore, the term "substantially U-shaped form" as used in this specification, etc. refers to, in other words, a state in which the first substrate is opposite to the second substrate, and the first substrate and the second substrate are each provided to make a substantially L-shaped form with the third substrate.

In addition, as used in the specification, etc., the ordinal numbers such as "first" or "second" are used for convenience to distinguish elements, and not for limiting the elements in terms of number, and even not for limiting the arrangement and the order of the steps.

According to the present invention, incident light is divided by the light-dividing devices into a plurality of wavelength bands, and made incident onto the photoelectric conversion elements provided at the bottom and side. Therefore, a photoelectric conversion device can be provided which is capable of generating a large amount of electric power. In addition, the light-dividing devices distribute pressures and impacts applied to the substrates at the bottom and sides. Thus, a photoelectric conversion device can be provided which has resistance to pressures and impacts.

BRIEF DESCRIPTION OF THE DRAWINGS

FIGS. 3A to 3C are diagrams illustrating an action principle of the photoelectric conversion device according to Embodiment 1.

DETAILED DESCRIPTION OF THE INVENTION

Figure 1A:
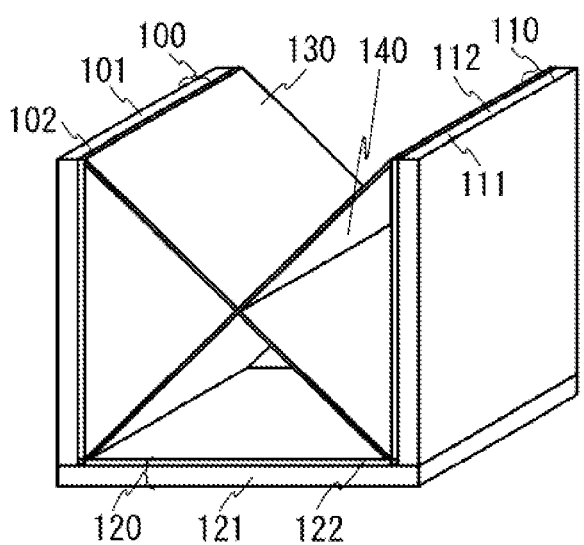
FIGS. 1A to 1C are diagrams illustrating the structure of a photoelectric conversion device according to Embodiment 1.

Embodiments will be described in detail with reference to the drawings. It is to be noted that the invention is not limited to the following description, and it will be easily understood by those skilled in the art that various changes and modifications can be made without departing from the spirit and scope of the invention. Therefore, the invention should not be construed as being limited to the description in the following embodiments. It is to be noted that in the structures of the invention described below, the same portions or portions having similar functions are denoted by the same reference numerals in different drawings, and description of such portions is not repeated.

Embodiment 1

In the present embodiment, a photoelectric conversion device according to an aspect of the invention to be disclosed will be described with reference to FIGS. 1A to 1C, FIGS. 2A to 2C, and FIGS. 3A to 3C.

<The Structure of the Photoelectric Conversion Device in the Present Embodiment>

Figure 1B:
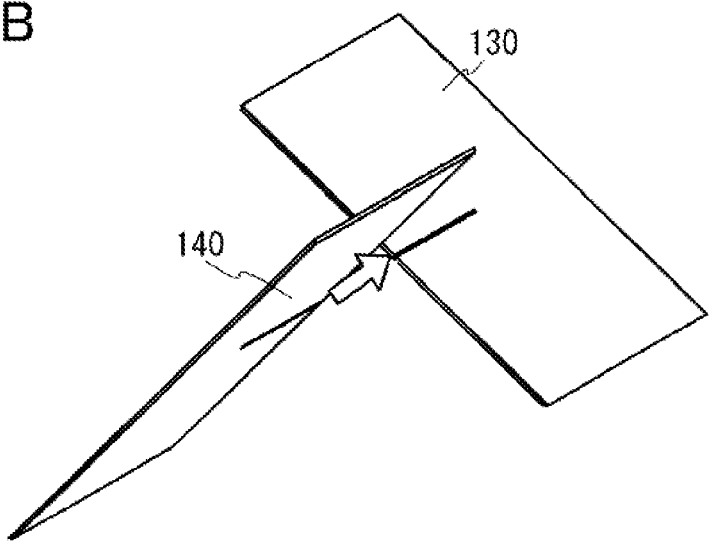
Figure 1C:
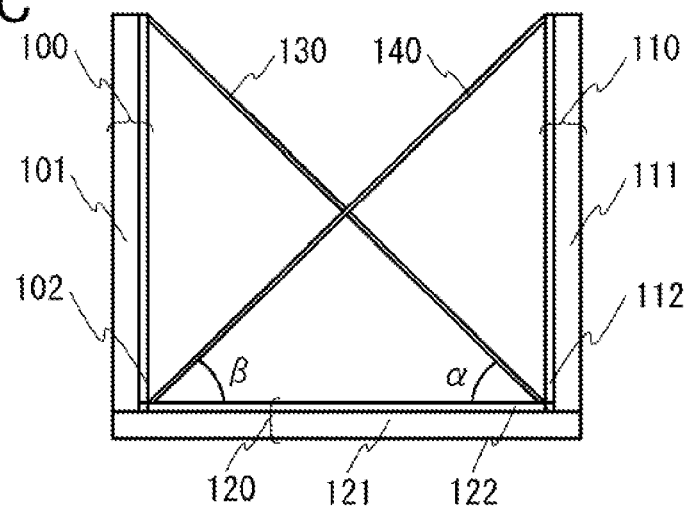

FIGS. 1A to 1C show structure diagrams of a photoelectric conversion device in the present embodiment. FIG. 1A is a perspective view of the photoelectric conversion device in the present embodiment, FIG. 1B is a diagram selectively illustrating a section of the structure in FIG. 1A, and FIG. 1C is a side view of FIG. 1A.

The photoelectric conversion device according to the present embodiment has, as shown in FIG. 1A, a first substrate 100 including a first base substrate 101 and a first photoelectric conversion element 102, a second substrate 110 including a second base substrate 111 and a second photoelectric conversion element 112, and a third substrate 120 including a third base substrate 121 and a third photoelectric conversion element 122, which are arranged in a substantially U-shaped form in such a way that the first photoelectric conversion element 102 is opposite to the second photoelectric conversion element 112, a first light-dividing device 130 is provided in such a way that the first substrate 100 and the third substrate 120 are secured in a brace form, and a second light-dividing device 140 is provided in such a way that the second substrate 110 and the third substrate 120 are secured in a brace form.

As the first photoelectric conversion element 102, a solar cell such as a silicon-based solar cell using, as a photoelectric conversion layer, a single layer or a stacked layer of single crystalline silicon, polycrystalline silicon, microcrystalline silicon, amorphous silicon, or the like, compound-based solar cell using, as a photoelectric conversion layer, InGaAs, GaAs, CdTe, CdS, a chalcopyrite based ternary compound, a dye-sensitized solar cell, an organic thin film solar cell, or a quantum dot solar cell may be used.

It is to be noted that the above-described first photoelectric conversion element 102 is an example of solar cells which can be manufactured by known techniques, and the photoelectric conversion element is not limited to the use of the above description only.

In addition, the same material and structure as described above may be used for the second photoelectric conversion element 112 and the third photoelectric conversion element 122.

In one aspect of the present invention, the plurality of photoelectric conversion elements are placed in different positions. Thus, light subjected to wavelength division by the light-dividing devices and made incident on the photoelectric conversion elements reaches the photoelectric conversion layers almost without any loss. In this regard, it can be said that the photoelectric conversion elements have a big merit as compared with a stack-type photoelectric conversion element.

In addition, in the stack-type photoelectric conversion element, a plurality of photoelectric conversion layers are connected in series, and the output current of the whole photoelectric conversion element is limited by the photoelectric conversion layer whose output current is the lowest. Thus, there is a need for current matching. However, in accordance with the technique in this specification, it is possible to use a plurality of photoelectric conversion layers without forming any stacked structure. Thus, it can be said that it is also a big merit to eliminate the need for such current matching as for the stack-type photoelectric conversion element.

It is to be noted that while the first substrate 100 includes the first base substrate 101 and the first photoelectric conversion element 102 in this specification, etc., the first photoelectric conversion element 102 may be used as the first substrate 100 without using the first base substrate 101.

For example, when the first photoelectric conversion element 102 is manufactured with the use of a poorly impact-resistant material (for example, a thin silicon substrate, a thin glass substrate, etc.), there is a possibility that the use of the first photoelectric conversion element 102 as the first substrate 100 may, in the case of an external impact applied, break the first photoelectric conversion element 102 before distributing the impact force to the first light-dividing device 130 which functions as a brace. In such a case, the first photoelectric conversion element 102 is preferably provided with the first base substrate 101 as described in this specification. However, it is not always necessary to provide the first base substrate 101 when the first photoelectric conversion element 102 has a strength to such an extent that the first photoelectric conversion element 102 is not broken by the external impact.

The same as in the case of the first substrate 100 applies to the second substrate 110 and the third substrate 120.

Therefore, whether or not to use the first base substrate 101, the second base substrate 111, and the third base substrate 121 may be selected appropriately by practitioners in consideration of the strength of the photoelectric conversion element and the usage environment of the photoelectric conversion element.

From this point of view, substrates of materials which have resistance to external impacts, such as a metal substrate, a plastic substrate, and a wood substrate, are preferably used as the first base substrate 101, the second base substrate 111, and the third base substrate 121.

The first light-dividing device 130 has the function of reflecting light in a certain wavelength band of external incident light toward the second photoelectric conversion element 112, and has the function of securing the first substrate 100 to the third substrate 120 so that the pressure and impact applied to the first substrate 100 are distributed to the third substrate 120 and the pressure and impact applied to the third substrate 120 are distributed to the first substrate 100.

The second light-dividing device 140 likewise has the function of reflecting light in a certain wavelength band of external incident light toward the first photoelectric conversion element 102, and has the function of securing the second substrate 110 to the third substrate 120 so that the pressure and impact applied to the second substrate 110 are distributed to the third substrate 120 and the pressure and impact applied to the third substrate 120 are distributed to the second substrate 110.

As described above, the first light-dividing device 130 and the second light-dividing device 140 each have the function as a "light-dividing device" for dividing incident light into light in a plurality of wavelength bands, and the function as a "brace" for securing the substrates on the bottom and side to increase the strength of the device.

It is to be noted that as a method for forming a cruciform light-dividing device including the first light-dividing device 130 and the second light-dividing device 140 as shown in FIG. 1A, for example, as shown in FIG. 1B, the first device 130 and the second light-dividing device 140 may be each provided partially with a groove, so that the groove of the second light-dividing device 140 is inserted into the groove of the first light-dividing device 130 to form a cruciform device.

As the first light-dividing device 130 and the second light-dividing device 140, dichroic mirrors and the like may be used which each have a dielectric layer stacked on a substrate with a light transmittance of 80% or more in a wavelength band from 350 nm to 2000 nm (for example, a clear flat glass substrate, a quartz substrate, a plastic substrate).

Further, the adjustment of the angle ($\alpha$ in FIG. 1C) of the fixing portion between the first light-dividing device 130 and the third substrate 120 enables the first light-dividing device 130 to efficiently reflect light toward the second photoelectric conversion element 112, and thus can increase the amount of electric power generated by the second photoelectric conversion element 112. Specifically, the first light-dividing device 130 and the third substrate 120 are preferably placed so that the angle of the fixing portion between the first light-dividing device 130 and the third substrate 120 is 35° or more and 65° or less, and more desirably 40° or more and 55° or less. For example, when the first substrate 100, the second substrate 110, and the third substrate 120 are arranged in a substantially U-shaped form as shown in FIG. 1C, the fixing angle between the first light-dividing device 130 and the third substrate 120 is preferably adjusted to approximately 45° ideally in order to efficiently reflect, toward the second substrate 110, incident light onto the photoelectric conversion device (see incident light 150 in FIG. 2B).

The second light-dividing device 140 is likewise preferably placed so that the angle ($\beta$ in FIG. 2A) of the fixing portion between the second light-dividing device 140 and the third substrate 120 is 35° or more and 65° or less, and more desirably 40° or more and 55° or less.

Figure 2A:
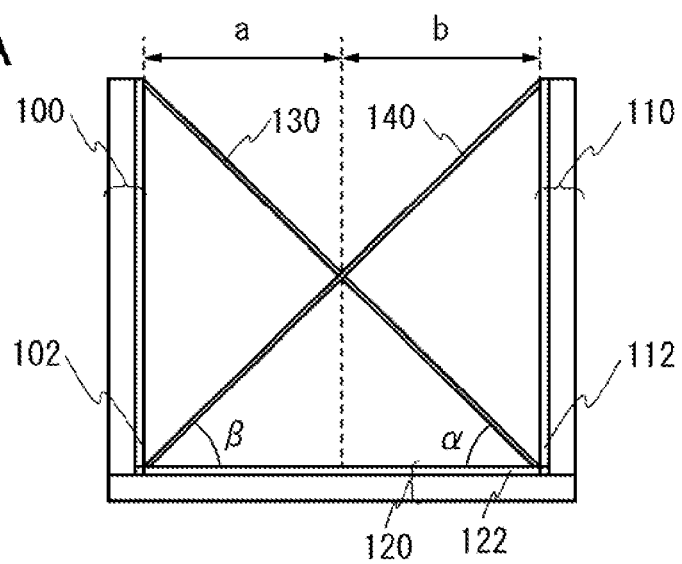
FIGS. 2A to 2C are diagrams illustrating an action principle of the photoelectric conversion device according to Embodiment 1.
Figure 2B:
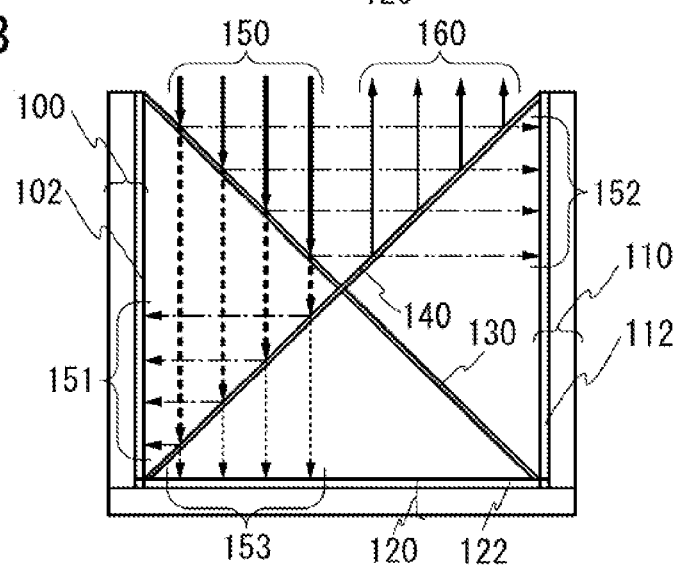

It is to be noted that when the reflection wavelength band of the first light-dividing device 130 is overlapped with the reflection wavelength band of the second light-dividing device, the light in the overlapped wavelength band is reflected by the first light-dividing device 130, and then further reflected by the second light-dividing device 140 to fail to fall on the photoelectric conversion element (see light 160 in FIG. 2B). For this reason, the reflection wavelength bands of the first light-dividing device 130 and the second light-dividing device 140 are desirably prevented from being overlapped with each other as much as possible, and specifically, the first light-dividing device 130 and the second light-dividing device 140 preferably have respective different wavelength bands for a reflectance of 80% or more in the wavelength band of 350 nm or more and 2000 nm or less.

<The Action. Principle and Effect of the Photoelectric Conversion Device in the Present Embodiment>

The traveling path of incident light for the case of external light incident on the photoelectric conversion device which has the structure according to the present embodiment, and the action principle for the force distributed when an external force is applied such as a pressure or an impact will be described with reference to FIGS. 2A to 2C and FIGS. 3A to 3C, and advantageous effects thereof will be described.

<The Traveling Path of Incident Light for the Case of External Incident Light>

Figure 2C:
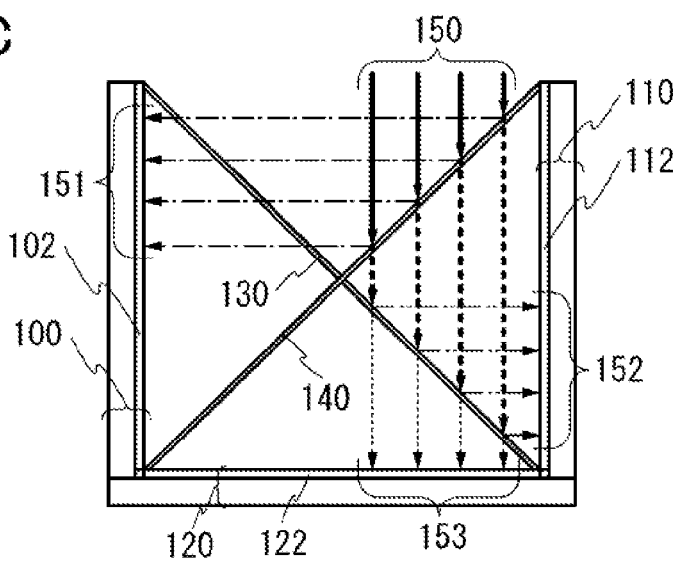

FIG. 2A is a side view of the photoelectric conversion device according to the present embodiment as shown in FIG. 1A, FIG. 2B shows the traveling path of light incident on a section a in FIG. 2A, and FIG. 2C shows the traveling path of light incident on a section b in FIG. 2A.

As shown in FIG. 2B, light 152 (alternate long and two short dashes line) in a certain wavelength band of the incident light 150 (thick solid line) onto the section a in FIG. 2A is first reflected by the first light-dividing device 130 toward the second photoelectric conversion element 112, and subjected to a photoelectric conversion in the second photoelectric conversion element 112.

For this reason, a photoelectric conversion element which shows a high photoelectric conversion efficiency in the wavelength band of the light 152 is preferably used for the second photoelectric conversion element 112. Specifically, a photoelectric conversion element is preferably used which has a wavelength band of 300 nm or more in total for 80% or more of the maximum of the photoelectric conversion efficiency in the wavelength band of the light 152, and further desirably, a photoelectric conversion element is preferably used which has the maximum of the photoelectric conversion efficiency in the wavelength band of the light 152 in addition to the above content.

Then, light 151 (alternate long and short dash line in FIG. 2B) in a certain wavelength band of the light (thick dotted line in FIG. 2B) transmitted though the first light-dividing device 130 is reflected by the second light-dividing device 140 toward the first photoelectric conversion element 102, and subjected to a photoelectric conversion in the first photoelectric conversion element 102.

For this reason, a photoelectric conversion element which shows a high photoelectric conversion efficiency in the wavelength band of the light 151 is preferably used for the first photoelectric conversion element 102. Specifically, a photoelectric conversion element is preferably used which has a wavelength band of 300 nm or more in total for 80% or more of the maximum of the photoelectric conversion efficiency in the wavelength band of the light 151, and further desirably, a photoelectric conversion element is preferably used which has the maximum of the photoelectric conversion efficiency in the wavelength band of the light 151 in addition to the above content.

Furthermore, light 153 (thin dotted line in FIG. 2B) in a certain wavelength band of the light transmitted though the second light-dividing device 140 is made incident on the third photoelectric conversion element 122, and subjected to a photoelectric conversion in the third photoelectric conversion element 122.

For this reason, a photoelectric conversion element which shows a high photoelectric conversion efficiency in the wavelength band of the light 153 is preferably used for the third photoelectric conversion element 122. Specifically, a photoelectric conversion element is preferably used which has a wavelength band of 300 nm or more in total for 80% or more of the maximum of the photoelectric conversion efficiency in the wavelength band of the light 153, and further desirably, a photoelectric conversion element is preferably used which has the maximum of the photoelectric conversion efficiency in the wavelength band of the light 153 in addition to the above content.

In addition, as for the light incident on the section b in FIG. 2A, as shown in FIG. 2C, light 151 (alternate lone and short dash line in FIG. 2C) in a certain wavelength band of the incident light 150 (thick solid line in FIG. 2C) onto the section b is first reflected by the second light-dividing device 140 toward the first photoelectric conversion element 102, and subjected to a photoelectric conversion in the first photoelectric conversion element 102.

Then, light 152 (alternate long and two short dashes line in FIG. 2C) in a certain wavelength band of the light (thick dotted line in FIG. 2C) transmitted though the second light-dividing device 140 is reflected by the first light-dividing device 130 toward the second photoelectric conversion element 112, and subjected to a photoelectric conversion in the second photoelectric conversion element 112.

Furthermore, light 153 (thin dotted line in FIG. 2C) in a certain wavelength band of the light transmitted though the first light-dividing device 130 is made incident on the third photoelectric conversion element 122, and subjected to a photoelectric conversion in the third photoelectric conversion element 122.

The incident light 150 is divided into the three wavelength bands of light through the paths described above, and subjected to photoelectric conversions by the photoelectric conversion elements suitable for the respective wavelength bands. Therefore, the structure shown in the present embodiment can provide a photoelectric conversion device which is capable of generating a large amount of electric power.

It is to be noted that the types of the photoelectric conversion elements used for the first photoelectric conversion element 102, the second photoelectric conversion element 112, and the third photoelectric conversion element 122 may be selected appropriately by practitioners, depending on the reflection wavelength bands of the first light-dividing device 130 and the second light-dividing device 140.

For example, when the first light-dividing device 130 intensively reflects light in a wavelength band of 700 nm or less and the second light-dividing device 140 intensively reflects light in a wavelength band of 1100 nm or more, a photoelectric conversion element (for example, a single crystalline germanium solar cell) which has a high photoelectric conversion efficiency in the wavelength band of 1100 nm or more may be used for the first photoelectric conversion element 102, a photoelectric conversion element (for example, an amorphous silicon solar cell) which has a high photoelectric conversion efficiency in the wavelength band of 700 nm or less may be used for the second photoelectric conversion element 112, and a photoelectric conversion element (for example, a single crystalline silicon solar cell) which has a high photoelectric conversion efficiency in the wavelength band of more than 700 nm and less than 1100 nm may be used for the third photoelectric conversion element 122.

<Force Distributed when External Force is Applied Such as Pressure or Impact>

FIG. 3A is a diagram illustrating a force distributed when an external pressure or impact is applied to the first substrate 100 as a side substrate, and FIG. 3B is a diagram illustrating a force distributed when an external pressure or impact is applied to the third substrate 120 as a bottom substrate.

As shown in FIG. 3A, when an external pressure or impact (a white arrow in FIG. 3A) is applied to the first substrate 100, the first light-dividing device 130 can partially distribute the force applied to the first substrate, to the third substrate 120 as the bottom (see a black arrow in FIG. 3A) through the fixing portion (a circular section of a dotted line in FIG. 3A) of the first substrate 100 and first light-dividing device 130.

In addition, when in the photoelectric conversion device according to the present embodiment, the groove provided in the first light-dividing device 130 is combined with the groove provided in the second light-dividing device 140 as shown in FIG. 1B, the force applied to the first light-dividing device 130 is partially distributed to the second light-dividing device 140 through the combined portion (a square section of a dotted line in FIG. 3A) of the first light-dividing device 130 and second light-dividing device 140, and also distributed to the second substrate 110. In this case, flexible materials such as plastic substrates are preferable for the first light-dividing device 130 and the second light-dividing device 140, so as to prevent the first light-dividing device 130 and the second light-dividing device 140 from being broken even when a strong force is applied to the groove portions of the first light-dividing device 130 and the second light-dividing device 140.

It is to be noted that while the first light-dividing device 130 is secured in contact with the first photoelectric conversion element 102 in the present embodiment, the present invention is not limited to this configuration. For example, the light-dividing device 130 may be secured in contact with the first base substrate 101. Likewise, while the first light-dividing device 130 is secured to and in contact with the third photoelectric conversion element 122, the first light-dividing device 130 may be secured in contact with the third base substrate 121.

In addition, while the first light-dividing device 130 is secured to the ends of the first substrate 100 and the third substrate 120, the present invention is not limited to this configuration, and the first light-dividing device 130 may be secured near the ends.

Further, as a method for securing the first substrate 100 and the first light-dividing device 130 to each other, and securing the third substrate 120 and the first light-dividing device 130 to each other, for example, various types of adhesive agents, thermoplastic resins, securing members (for example, an L-shaped bracket made of metal or plastic), etc. may be used. In addition, the securing may be carried out by welding, as long as the materials of the first substrate 100, the third substrate 120, and the first light-dividing device 130 allow for direct welding between the first substrate 100 and the first light-dividing device 130, and between the third substrate 120 and the first light-dividing device 130. Moreover, as for a method for securing the second substrate 110 and the second light-dividing device 140 to each other, and securing the third substrate 120 and the second light-dividing device 140 to each other, the same methods may be also employed.

As described above, when the first substrate 100 and the third substrate 120 are secured in a brace form by the first light-dividing device 130, the first light-dividing device 130 can distribute a pressure or an impact applied to the first substrate 100, to the third substrate 120 as the bottom.

In addition, when an external pressure or impact is applied to the second substrate 110 placed so as to be opposite to the first substrate 100, the force can be also distributed to the third substrate 120 through the fixing portion of the second substrate 110 and the second light-dividing device 140 in the same manner as described above.

It is to be noted that while the second light-dividing device 140 is secured in contact with the second photoelectric conversion element 112 as shown in FIG. 3A, the present invention is not limited to this configuration. For example, the light-dividing device 140 may be secured in contact with the second base substrate 111. Likewise, while the second light-dividing device 140 is secured in contact with the third photoelectric conversion element 122, the second light-dividing device 140 may be secured in contact with the third base substrate 121.

In addition, while the second light-dividing device 140 is secured to the ends of the second substrate 110 and the third substrate 120, the present invention is not limited to this configuration, and the second light-dividing device 140 may be secured near the ends.

As described above, when the second substrate 110 and the third substrate 120 are secured in a brace form by the second light-dividing device 140, the second light-dividing device 140 can distribute a pressure or an impact applied to the second substrate 110, to the third substrate 120 as the bottom.

In addition, when an external pressure or impact is applied to the third substrate 120, as shown in FIG. 3B, the first light-dividing device 130 and the second light-dividing device 140 can distribute the force (a white arrow in FIG. 3B) applied to the third substrate 120, to the first substrate 100 and the second substrate 110 (see black arrows in FIG. 3B).

As described above, the first light-dividing device 130 and the second light-dividing device 140 not only serve as light-dividing devices as shown in FIGS. 2B and 2C, but also serve to distribute an external pressure or impact as shown in FIGS. 3A and 3B. Accordingly, a photoelectric conversion device can be provided which has resistance to pressures and impacts.

Further, the photoelectric conversion device described in the present embodiment, in which the first substrate 100 including the first photoelectric conversion element 102, the second substrate 110 including the second photoelectric conversion element 112, and the third substrate 120 including the third photoelectric conversion element 122 are arranged in the substantially U-shaped form, can effectively achieve two advantages of: (1) dividing incident light into a plurality of wavelength bands with the use of the light-dividing devices, thereby generating a large amount of electric power; and (2) having resistance to externally applied pressures and impacts.

Furthermore, when the first substrate 100, the second substrate 110, and the third substrate 120 are arranged in the substantially U-shaped form as described above, the photoelectric conversion device can be set in the same level of area as in the case of placing a substrate including a photoelectric conversion element in a two-dimensional fashion (for example, setting only the third substrate 120 as the bottom substrate in FIG. 3A), and the device area can be thus prevented from being increased.

Further, for the photoelectric conversion device described above, the methods for further increasing the resistance to externally applied pressures and impacts include a method of securing a protective substrate 310 to or near the upper ends of the first substrate 100 and the second substrate 110 in a region overlapping with the third substrate 120 as shown in FIG. 3C.

The protective substrate 310 placed as shown in FIG. 3C can, when external pressures or impacts (white arrows in FIG. 3C) are applied to the first substrate 100 and the second substrate 110 as the side substrates, partially distribute the forces (black arrows in FIG. 3C) to the opposite substrates through not only the first light-dividing device 130 and the second light-dividing device 140 but also the protective substrate 310.

In addition, the protective substrate 310 is placed so as to cover the first light-dividing device 130 and the second light-dividing device 140, and thus has the function of protecting the first light-dividing device 130 and the second light-dividing device 140 from impacts due to blown-off objects. Therefore, a photoelectric conversion device can be provided which is capable of generating a large amount of electric power over a long period of time.

Embodiment 2

In the present embodiment, a function will be described with reference to FIGS. 4A and 4B, which is different from that of the photoelectric conversion device according to one aspect of the present invention as described in Embodiment 1.

<The Structure of the Photoelectric Conversion Device in the Present Embodiment>

Figure 4A:
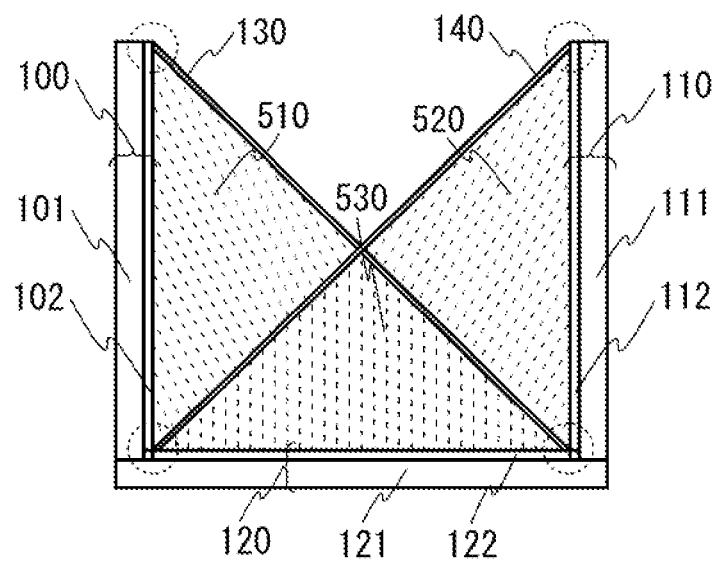
FIGS. 4A and 4B are diagrams illustrating the structure and action principle of a photoelectric conversion device according to Embodiment 2.

FIG. 4A is a side view of the same photoelectric conversion device as in FIG. 2A. The photoelectric conversion device described in the present embodiment has a structure as shown in FIG. 4A, in which a first hollow section 510 surrounded by the first substrate 100, the first light-dividing device 130, and the second light-dividing device 140, a second hollow section 520 surrounded by the second substrate 110, the first light-dividing device 130, and the second light-dividing device 140, and a third hollow section 530 surrounded by the third substrate 120 the first light-dividing device 130, and the second light-dividing device 140 are formed by securing the fixing portions (circular sections of dotted lines in FIG. 4A) of the substrates and light-dividing devices.

<The Action Principle and Effect of the Photoelectric Conversion Device in the Present Embodiment>

In the photoelectric conversion device with the structure in FIG. 4A, the introduction of a temperature regulating material into at least one of the first hollow section 510, the second hollow section 520, and the third hollow section 530 can regulate the temperature of at least one of the first photoelectric conversion element 102, the second photoelectric conversion element 112, and the third photoelectric conversion element 122.

Figure 4B:
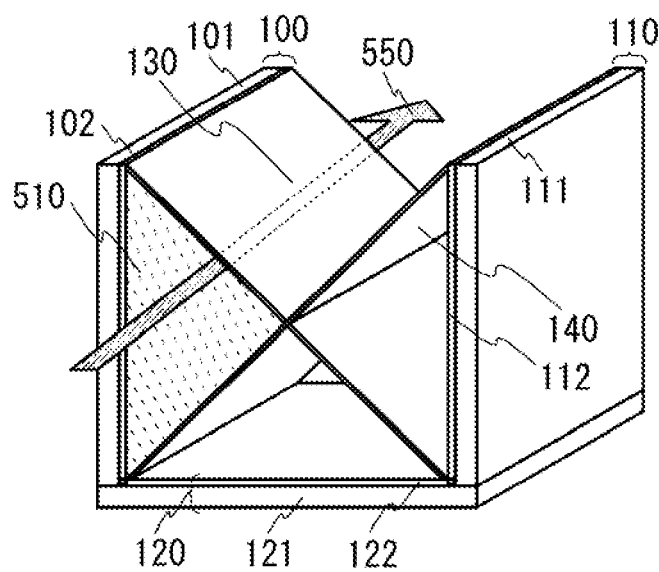

For example, when the temperature of the first photoelectric conversion element 102 is increased to decrease its electric generating capability, whereas the second photoelectric conversion element 112 and the third photoelectric conversion element 122 undergo no decrease in electric generating capability in FIG. 4A, the first photoelectric conversion element 102 can be selectively cooled by, for example, flowing a coolant into, or forcing air to pass through only the first hollow section 510 as a temperature regulating material 550, as shown in FIG. 4B. This cooling decreases the temperature of the first photoelectric conversion element 102 to recover the electric generating capability.

In this case, light incident on the second photoelectric conversion element 112 undergoes no loss due to light absorption or reflection by the temperature regulating material 550, because the temperature regulating material 550 is not introduced into the second hollow section 520 or the third hollow section 530. In addition, light incident on the third photoelectric conversion element 122 can undergo a reduced loss due to light absorption or reflection by the temperature regulating material 550.

Therefore, a photoelectric conversion device can be provided which suppresses a decrease in the amount of electric power generation due to changes in the temperatures of the photoelectric conversion elements, and a loss in the amount of electric power generation due to the temperature regulating material.

It is to be noted that the state (solid, liquid, or gas), shape, and quality of the material of the temperature regulating material 550 are not particularly limited, as long as the material can pass through the first hollow section 510, the second hollow section 520, and the third hollow section 530, and any material may be used as long as the material causes no damage such as deterioration, deformation, or breaking due to chemical reactions to the components of the photoelectric conversion device, and as long as the operating temperature range causes no deformation of the components of the photoelectric conversion device. For the temperature regulating material 550, not only materials which can cool the photoelectric conversion elements as in the example described above, but also materials which can heat the photoelectric conversion device may be used.

In addition, in the case of using, for example, a liquid, a gas, or a quite small sized solid as the temperature regulating material 550, the first hollow section 510 is preferably surrounded without any gap by the first substrate 100, the first light-dividing device 130, and the second light-dividing device 140. Furthermore, the second hollow section 520 and the third hollow section 530 are likewise preferably surrounded without any gap by the surrounding substrates and light-dividing devices. This surrounding can prevent a temperature regulating material introduced into a specific hollow section from flowing into the other hollow sections.

Embodiment 3

In the present embodiment, a photoelectric conversion device will be described with reference to FIGS. 5A to 5C and FIGS. 6A and 6B, which includes the plurality of photoelectric conversion devices described in the embodiments above.

Figure 5A:
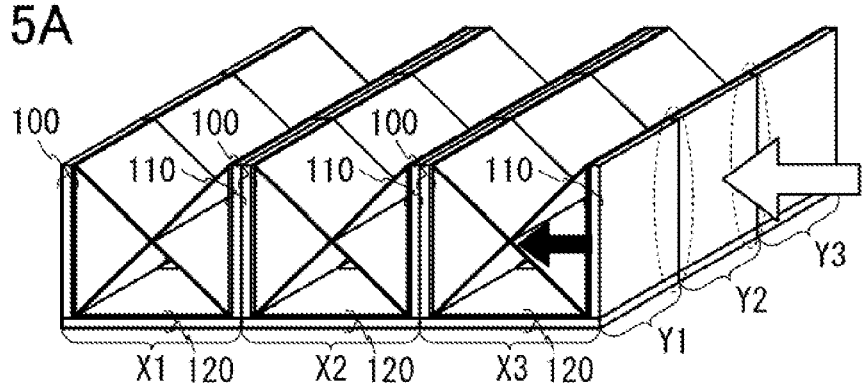
FIGS. 5A to 5C are diagrams illustrating the structure and action principle of a photoelectric conversion device according to Embodiment 3.

It is to be noted that when one photoelectric conversion device is to be specified among the plurality of placed photoelectric conversion devices, the device is represented by using coordinates in FIGS. 5A to 5C and FIGS. 6A and 6B. For example, the photoelectric conversion device placed in the center of FIG. 5A is represented as the "photoelectric conversion device in the range of X2 and Y2", and the three photoelectric conversion devices placed in the front in FIG. 5A are represented as the "photoelectric conversion devices in the range of X1-X2-X3 and Y1".

<The Structure of the Photoelectric Conversion Device in the Present Embodiment>

Figure 5B:
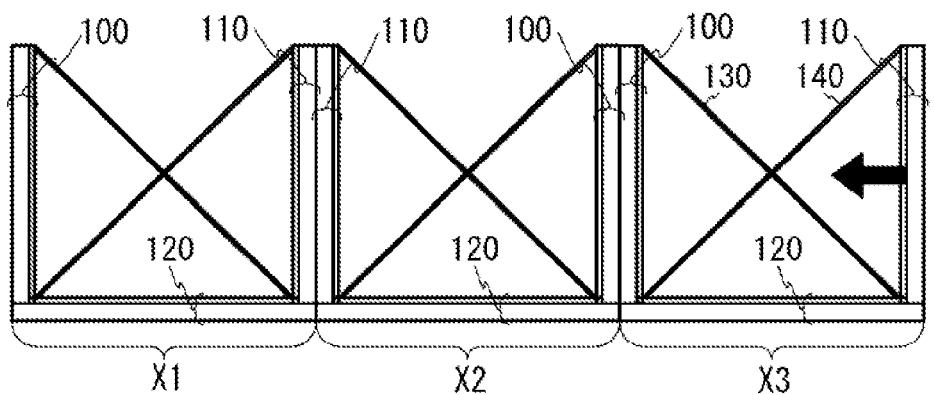
Figure 5C:
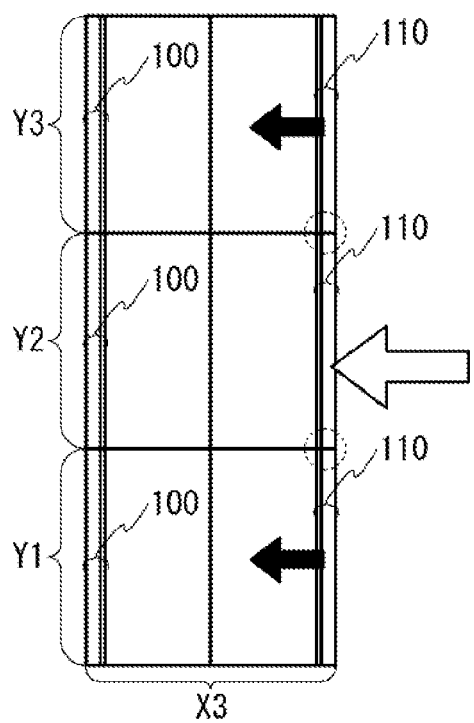

FIG. 5A is a diagram illustrating a photoelectric conversion device in which a plurality of photoelectric conversion devices with the structure of FIG. 1A as described in Embodiment 1 are placed so that light-dividing devices are oriented in the same direction, FIG. 5B is a side view of three photoelectric conversion devices in the range of X1-X2-X3 and Y1 in FIG. 5A, and FIG. 5C is a top view of three photoelectric conversion devices in the range of X3 and Y1-Y2-Y3.

Figure 6A:
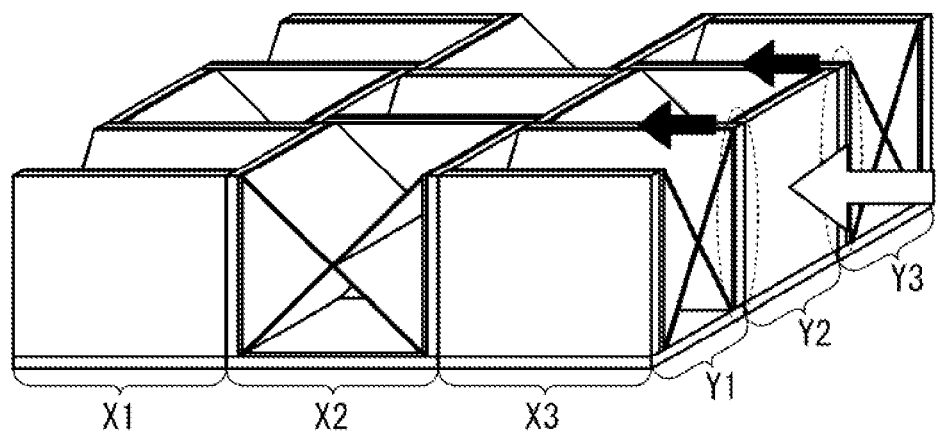
FIGS. 6A and 6B are diagrams illustrating the structure and action principle of the photoelectric conversion device according to Embodiment 3.

In addition, FIG. 6A is a diagram illustrating a photoelectric conversion device in which a plurality of photoelectric conversion devices are placed in a manner different from FIGS. 5A to 5C, and FIG. 6B is a top view of three photoelectric conversion devices in the range of X3 and Y1-Y2-Y3 in FIG. 6A.

The photoelectric conversion devices described in the present embodiment have a structure in which the end surfaces of the first substrate 100 and the second substrate 110 of the photoelectric conversion device are secured to portions of the adjacent photoelectric conversion devices, as shown in FIGS. 5A to 5C and FIGS. 6A and 6B.

It is to be noted that, for example, various types of adhesive agents, thermoplastic resins, etc. may be used as a method for securing the end surfaces of the first substrate 100 and the second substrate 110 of the photoelectric conversion device to portions of the adjacent photoelectric conversion devices. In addition, the securing may be carried out by welding, as long as the materials allow for direct welding.

<The Action Principle and Effect of the Photoelectric Conversion Device in the Present Embodiment>

With the use of the structure as in FIG. 5A, for example, even when a force such as a pressure or an impact is applied to the second substrate 110 of the photoelectric conversion device in the range of X3 and Y2 in FIG. 5A (white arrows in FIGS. 5A and 5C), the force is partially distributed to the second substrate 110 of the photoelectric conversion device in the range of X3 and Y1 in FIG. 5A and the second substrate 110 of the photoelectric conversion device in the range of X3 and Y3 in FIG. 5A (black arrows in FIGS. 5A, 5B, and 5C) through fixing portions (circular portions of dotted lines in FIGS. 5A and 5C). The distributed force is further partially distributed to the third substrate 120 through the light-dividing device 140.

Figure 6B:
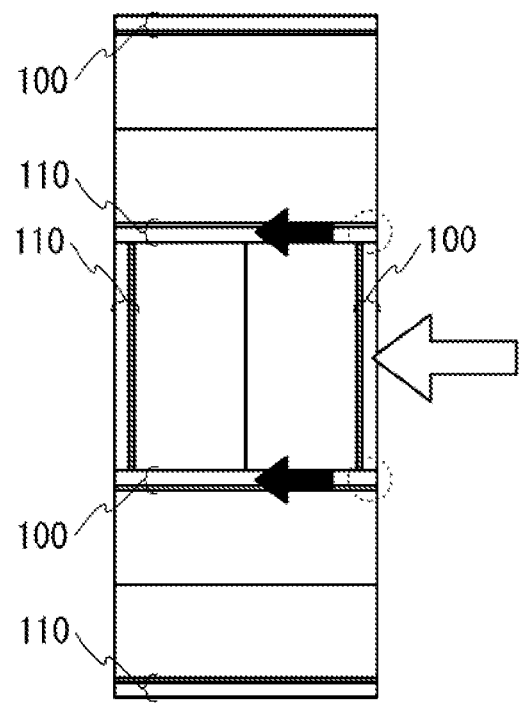

In addition, with the use of the structure as in FIG. 6A, for example, even when a force such as a pressure or an impact is applied to the first substrate 100 of the photoelectric conversion device in the range of X3 and Y2 in FIG. 6A (white arrows in FIGS. 6A and 6B), the force is partially distributed to the first substrate 100 of the photoelectric conversion device in the range of X3 and Y1 in FIG. 6A and the second substrate 110 of the photoelectric conversion device in the range of X3 and Y3 in FIG. 6A (black arrows in FIGS. 6A and 6B) through fixing portions (circular portions of dotted lines in FIGS. 6A and 6B).

Therefore, the photoelectric conversion device in which a plurality of photoelectric conversion devices as described in Embodiment 1 are placed can be provided with resistance to pressures and impacts.

Embodiment 4

In the present embodiment, a function will be described with reference to FIGS. 7A and 7B, which is different from those of the photoelectric conversion devices according to one aspect of the present invention as described in Embodiment 3.

Figure 7A:
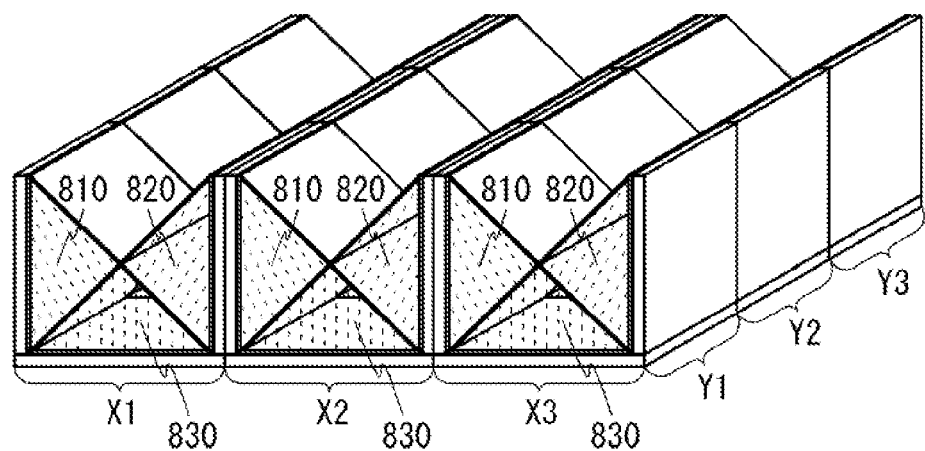
FIGS. 7A and 7B are diagrams illustrating the structure and action principle of a photoelectric conversion device according to Embodiment 4.
Figure 7B:
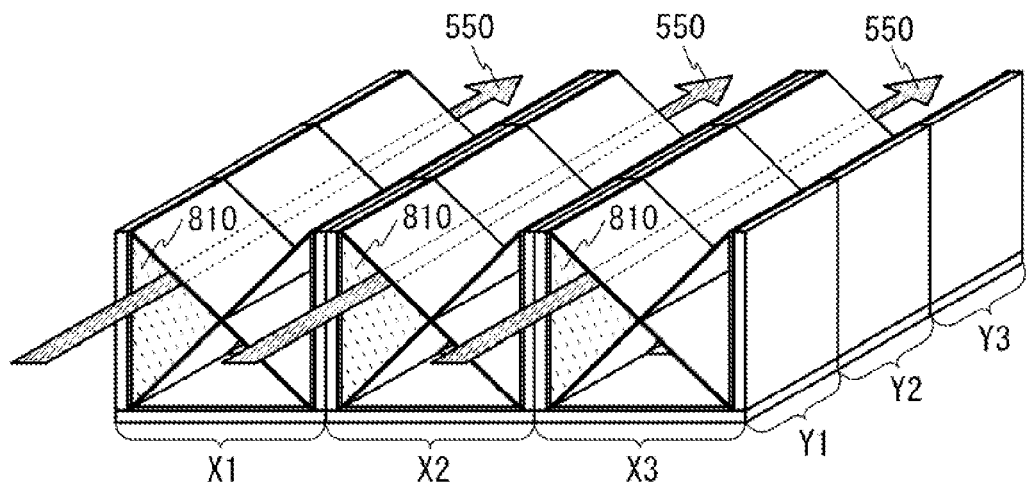

It is to be noted that when one photoelectric conversion device is to be specified among a plurality of placed photoelectric conversion devices in FIGS. 7A and 7B, the photoelectric conversion device is represented in the same manner as in Embodiment 3.

<The Structure of the Photoelectric Conversion Device in the Present Embodiment>

FIG. 7A is a diagram of a photoelectric conversion device in which a plurality of photoelectric conversion devices are placed so that light-dividing devices are oriented in the same direction as in the case of FIG. 5A described in Embodiment 3. The photoelectric conversion device according to the present embodiment has a structure including a first through hole 810 obtained by coupling the first hollow sections 510 of the photoelectric conversion devices shown in FIG. 4A, a second through hole 820 obtained by coupling the second hollow sections 520 thereof, and a third through hole 830 obtained by coupling the third hollow sections 530 thereof, as shown in FIG. 7A.

<The Action Principle and Effect of the Photoelectric Conversion Device in the Present Embodiment>

As shown in FIG. 7A, in the structure including the first through hole 810, second through hole 820, and third through hole 830 which are independent from each other, the introduction of the temperature regulating material 550 into at least one of the first through hole 810, the second through hole 820, and the third through hole 830 can regulate the temperatures of the photoelectric conversion elements adjacent to the first through hole 810, the second through hole 820, and the third through hole 830.

Accordingly, as in the case of Embodiment 2, a photoelectric conversion device can be provided which suppresses a decrease in the amount of electric power generation due to increases in the temperatures of the photoelectric conversion elements, and a loss in the amount of electric power generation due to the temperature regulating material.

This application is based on Japanese Patent Application serial no. 2010-281758 filed with Japan Patent Office on Dec. 17, 2010, the entire contents of which are hereby incorporated by reference.

What is claimed is:

1. A device comprising a first photoelectric conversion unit in direct contact with a second photoelectric conversion unit, each comprising:
   a first substrate comprising a first photoelectric conversion element;
   a second substrate comprising a second photoelectric conversion element;
   a third substrate comprising a third photoelectric conversion element;
   a first light-dividing device over the third substrate;
   and a second light-dividing device over the third substrate,
   wherein the first light-dividing device intersects the second light-dividing device,
   wherein the first substrate, the second substrate, and the third substrate are arranged in a substantially U-shaped form,
   wherein the first substrate and the second substrate are in direct contact with the third substrate,
   wherein the first substrate and the third substrate are secured in a brace form by the first light-dividing device which extends diagonally from the first substrate to the third substrate,
   wherein the second substrate and the third substrate are secured in a brace form by the second light-dividing device which extends diagonally from the second substrate to the third substrate,
   wherein the first photoelectric conversion element is opposite to the second photoelectric conversion element,
   wherein the first light-dividing device is configured to reflect a part of an incident light toward the second photoelectric conversion element,
   wherein the second light-dividing device is configured to reflect a part of the incident light toward the first photoelectric conversion element,
   wherein the third photoelectric conversion element is configured to receive light transmitted through the first light-dividing device and the second light-dividing device, and
   wherein the first photoelectric conversion unit and the second photoelectric conversion unit are oriented in different directions from each other.

2. The device according to claim 1, wherein in each photoelectric conversion unit at least one of the first light-dividing device and the second light-dividing device comprises a dichroic mirror.

3. The device according to claim 1, wherein in each photoelectric conversion unit the first light-dividing device and the second light-dividing device reflect different wavelength bands for a reflectance of 80% or more in a wavelength band of 350 nm or more and 2000 nm or less.

4. The device according to claim 1, wherein the first substrate and the second substrate of the first photoelectric conversion unit each have an end surface secured to a surface of the second photoelectric conversion unit.

5. The device according to claim 1, each of the first photoelectric conversion unit and the second photoelectric conversion unit further comprising:
 a first section surrounded by the first substrate, the first light-dividing device, and the second light-dividing device;
 a second section surrounded by the second substrate, the first light-dividing device, and the second light-dividing device; and
 a third section surrounded by the third substrate, the first light-dividing device, and the second light-dividing device,
 wherein at least one of the first, second and third sections is filled with a temperature regulating material.

6. The device according to claim 1, each of the first photoelectric conversion unit and the second photoelectric conversion unit further comprising a protective substrate over the third substrate, wherein the protective substrate is secured to upper ends of the first substrate and the second substrate.

7. A device comprising a first photoelectric conversion unit in direct contact with a second photoelectric conversion unit, each comprising:
 a first substrate comprising a first photoelectric conversion element;
 a second substrate comprising a second photoelectric conversion element;
 a third substrate comprising a third photoelectric conversion element;
 a first light-dividing device over the third substrate;
 a second light-dividing device over the third substrate,
 wherein the first light-dividing device intersects the second light-dividing device,
 wherein the first substrate, the second substrate, and the third substrate are arranged in a substantially U-shaped form,
 wherein the first substrate and the second substrate are in direct contact with the third substrate,
 wherein the first substrate and the third substrate are secured by the first light-dividing device extending diagonally from the first substrate to the second substrate,
 wherein the second substrate and the third substrate are secured by the second light-dividing device extending diagonally from the first substrate to the second substrate,
 wherein the first photoelectric conversion element is opposite to the second photoelectric conversion element, and
 wherein the first photoelectric conversion unit and the second photoelectric conversion unit are oriented in different directions from each other.

8. The device according to claim 7, wherein in each photoelectric conversion unit at least one of the first light-dividing device and the second light-dividing device comprises a dichroic mirror.

9. The device according to claim 7,
 wherein in each photoelectric conversion unit the first light-dividing device is configured to reflect a part of an incident light toward the second photoelectric conversion element,
 wherein the second light-dividing device is configured to reflect a part of the incident light toward the first photoelectric conversion element, and
 wherein the third photoelectric conversion element is configured to receive light transmitted through the first light-dividing device and the second light-dividing device.

10. The device according to claim 7, wherein in each photoelectric conversion unit the first light-dividing device and the second light-dividing device reflect different wavelength bands for a reflectance of 80% or more in a wavelength band of 350 nm or more and 2000 nm or less.

11. The device according to claim 7, wherein the first substrate and the second substrate of the first photoelectric conversion unit each have an end surface secured to a surface of the second photoelectric conversion unit.

12. The device according to claim 7, each of the first photoelectric conversion unit and the second photoelectric conversion unit further comprising:
 a first section surrounded by the first substrate, the first light-dividing device, and the second light-dividing device;
 a second section surrounded by the second substrate, the first light-dividing device, and the second light-dividing device; and
 a third section surrounded by the third substrate, the first light-dividing device, and the second light-dividing device,
 wherein at least one of the first, second and third sections is filled with a temperature regulating material.

13. The device according to claim 7, each of the first photoelectric conversion unit and the second photoelectric conversion unit further comprising a protective substrate over the third substrate, wherein the protective substrate is secured to upper ends of the first substrate and the second substrate.

14. A device comprising a first photoelectric conversion unit in direct contact with a second photoelectric conversion unit, each comprising:
 a first substrate comprising a first photoelectric conversion element;
 a second substrate comprising a second photoelectric conversion element;
 a third substrate comprising a third photoelectric conversion element;
 a first light-dividing device over the third substrate; and
 a second light-dividing device over the third substrate,
 wherein the first light-dividing device intersects the second light-dividing device,
 wherein the first substrate and the second substrate are provided in direct contact with and substantially perpendicular to the third substrate,
 wherein the first photoelectric conversion element is opposite to the second photoelectric conversion element,
 wherein the first substrate and the third substrate are secured by the first light-dividing device extending diagonally from the first substrate to the second substrate,
 wherein the second substrate and the third substrate are secured by the second light-dividing device extending diagonally from the first substrate to the second substrate, and
 wherein the first photoelectric conversion unit and the second photoelectric conversion unit are oriented in different directions from each other.

15. The device according to claim 14,
wherein in each photoelectric conversion unit at least one of the first light-dividing device and the second light-dividing device comprises a dichroic mirror.

16. The device according to claim 14,
wherein in each photoelectric conversion unit the first light-dividing device is configured to reflect a part of an incident light toward the second photoelectric conversion element,
wherein the second light-dividing device is configured to reflect a part of the incident light toward the first photoelectric conversion element, and
wherein the third photoelectric conversion element is configured to receive light transmitted through the first light-dividing device and the second light-dividing device.

17. The device according to claim 14, wherein in each photoelectric conversion unit the first light-dividing device and the second light-dividing device reflect different wavelength bands for a reflectance of 80% or more in a wavelength band of 350 nm or more and 2000 nm or less.

18. The device according to claim 14, wherein the first substrate and the second substrate of the first photoelectric conversion unit each have an end surface secured to a surface of the second photoelectric conversion unit.

19. The device according to claim 14, each of the first photoelectric conversion unit and the second photoelectric conversion unit further comprising:
a first section surrounded by the first substrate, the first light-dividing device, and the second light-dividing device;
a second section surrounded by the second substrate, the first light-dividing device, and the second light-dividing device; and
a third section surrounded by the third substrate, the first light-dividing device, and the second light-dividing device,
wherein at least one of the first, second and third sections is filled with a temperature regulating material.

20. The device according to claim 14, each of the first photoelectric conversion unit and the second photoelectric conversion unit further comprising a protective substrate over the third substrate, wherein the protective substrate is secured to upper ends of the first substrate and the second substrate.

* * * * *